United States Patent [19]
Wendell

[11] Patent Number: 5,155,391
[45] Date of Patent: * Oct. 13, 1992

[54] SYNCHRONOUS INTERNAL CLOCK DISTRIBUTION

[75] Inventor: Dennis L. Wendell, Pleasonton, Calif.

[73] Assignee: National Semiconductor Corporation, Santa Clara, Calif.

[*] Notice: The portion of the term of this patent subsequent to Dec. 24, 2008 has been disclaimed.

[21] Appl. No.: 642,098

[22] Filed: Jan. 16, 1991

Related U.S. Application Data

[63] Continuation of Ser. No. 601,154, Oct. 22, 1990.

[51] Int. Cl.5 .................. H03K 19/00; H03K 19/02
[52] U.S. Cl. ............................. 307/475; 307/446; 307/480
[58] Field of Search ............. 307/475, 480, 481, 455, 307/446, 270

[56] References Cited

U.S. PATENT DOCUMENTS

| | | | |
|---|---|---|---|
| 4,578,601 | 3/1986 | McAlister | 307/481 |
| 4,692,641 | 9/1987 | Highton | 307/475 |
| 4,761,567 | 8/1988 | Walters, Jr. et al. | 307/475 |
| 4,794,317 | 12/1988 | van Tran | 307/475 |
| 4,816,700 | 3/1989 | Imel | 307/480 |
| 4,849,660 | 7/1989 | Hayashi et al. | 307/475 |
| 4,855,624 | 8/1989 | Kertis et al. | 307/475 |
| 4,891,535 | 1/1990 | Etheridge | 307/475 |

*Primary Examiner*—Edward P. Westin
*Assistant Examiner*—Andrew Sanders
*Attorney, Agent, or Firm*—Irving Rappaport; Robert C. Colwell; Richard L. Hughes

[57] ABSTRACT

A clock signal for use in a BiCMOS device is driven over a high capacitance wire at ECL levels. Local CMOS circuits are activated using local ECL-to-CMOS translators. This configuration reduces clock signal delay and skew and provides for greater temperature independence.

6 Claims, 3 Drawing Sheets

SYNCHRONOUS INTERNAL CLOCK DISTRIBUTION

This is a continuation of U.S. patent application Ser. No. 07/601,154 field Oct. 22, 1990.

BACKGROUND OF THE INVENTION

The present invention relates to providing t synchronous clock signals of unequal voltages and in particular to providing, on a BiCMOS chip, an ECL clock signal for driving a high-capacitance line and one or more higher-voltage synchronous CMOS clock signals for driving CMOS circuits.

BiCMOS integrated circuits are useful for providing, on a single chip, both the desirable switching speeds of bipolar devices and the desirably low surface area requirements of CMOS devices. Typically, a bipolar device of much small area can charge and discharge larger loads compared to a CMOS device. The bipolar devices on such a chip are typically clocked by a clock signal with a potential of about 1 volt, which is the typical voltage for emitter-coupled logic (ECL) type of bipolar devices. In many BiCMOS chips, the CMOS devices are not separately clocked. In cases which a separate clock signal is used for clocking the CMOS devices, such a separate clock signal is typically the result of translating the ECL clock signal to a second, higher voltage, such as about 5 volts.

In a typical BiCMOS device, at least one clock signal is applied to a high-capacitance clock signal distribution line or "C-wire". For purposes of the present discussion a high-capacitance line is a line with a capacitance greater than about 0.2 pf. Not uncommonly, clock signal distribution lines have a capacitance of 10 pf or more. In pure CMOS designs the 5 volt CMOS-level clock signal was used to drive the C-wire.

SUMMARY OF THE INVENTION

The present invention includes the recognition of certain difficulties found in previous devices. In previous devices, the C-wire, being driven at CMOS levels, was relatively slow. According to the present invention, the ECL level clock signal is used to drive the C-wire, which results in reduced clock signal delay and skew. According to the present invention, an ECL-level clock input is buffered-up, e.g., to drive the load ECL inverters. The ECL level drive signal then drives the clock distribution C-wire load. The ECL signal is translated to a higher voltage signal for CMOS circuits. Preferably, the ECL signal is translated locally at each site required to activate CMOS circuits.

The clock signal can be distributed around the chip at ECL levels, minimizing delay and clock skew, yet circuits requiring CMOS-level clock signals can obtain these from local translators. The ECL driver can more effectively drive large capacitive loads.

DESCRIPTION OF THE PREFERRED EMBODIMENT

Figure 1:
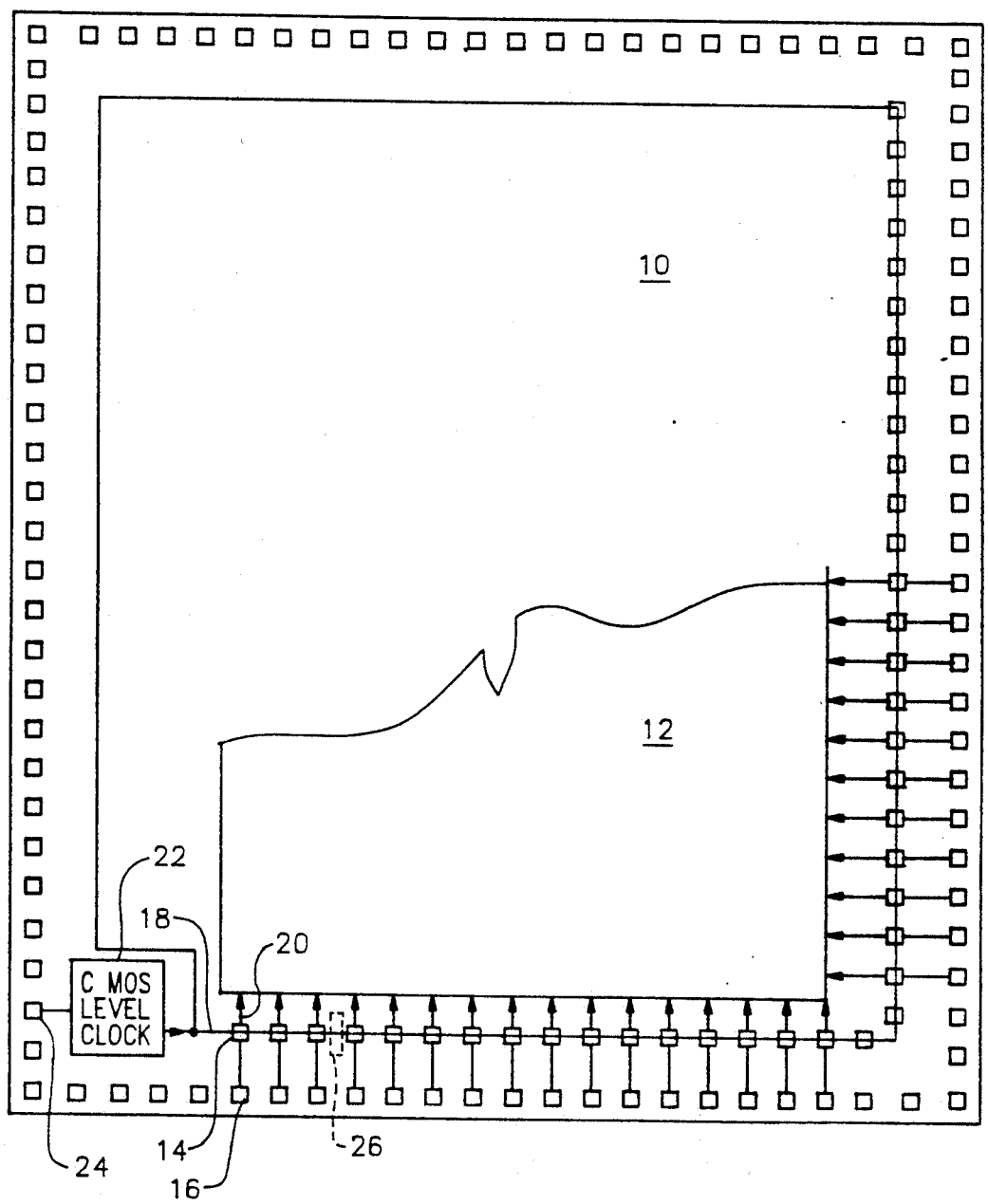
FIG. 1 is a schematic diagram of clock signal distribution according to previous devices.

FIG. 1 depicts, schematically, a chip 10 having at least a portion 12 of the circuitry on the chip responsive to the output from CMOS devices 14. Each of the CMOS devices 14 receives two inputs. For example, in the embodiment depicted in FIG. 1, the first input is from one of the peripheral pads 16 of the chip 10. The second input is a clock signal input which is distributed around the chip 10 over the C-wire conductor 18. The CMOS devices 14 provide an output 20 to the circuitry 12 at a predetermined portion of the clock signal, such as a falling edge, if the corresponding pin 16 has a predetermined potential. The CMOS circuitry 14 can be, for example, a decoder.

Because, in the configuration shown in FIG. 1, the CMOS circuit 14 receives clock input directly from the C-wire 18, the C-wire 18 is driven at a CMOS level, i.e., at about 5 volts. A clock driver circuit 22 provides the CMOS-level clock signal in response to an external clock signal provided through a pad 24.

Figure 2:
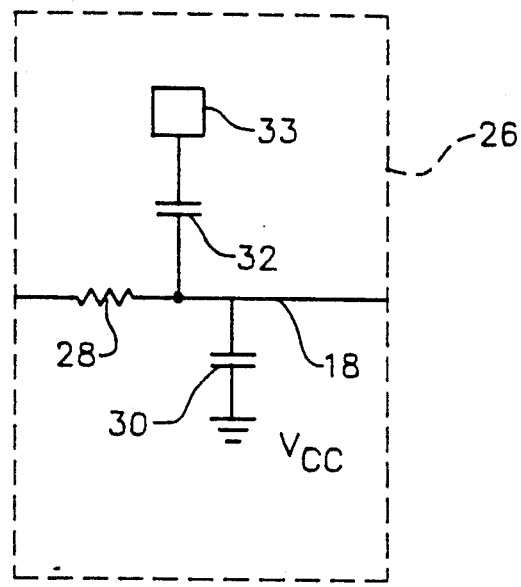
FIG. 2 is a partial schematic view of the C-wire shown in FIG. 1, depicting parasitic capacitance.

The C-wire 18 has relatively high capacitance under operating conditions for the chip 10. Because of the presence of adjacent circuitry and signal lines (such as on other levels of the chip 10) a portion of the C-wire 26 which would appear to be substantially non-capacitive is, in fact, subject to parasitic capacitance as depicted in FIG. 2. The C-wire 18 in addition to having an inherent resistance 28 has an amount of capacitance 30 arising from its proximity to a ground plane, as well as capacitance 32 which may arise from signal lines or devices 33 on other levels or adjacent to the C-wire 18.

Figure 4:
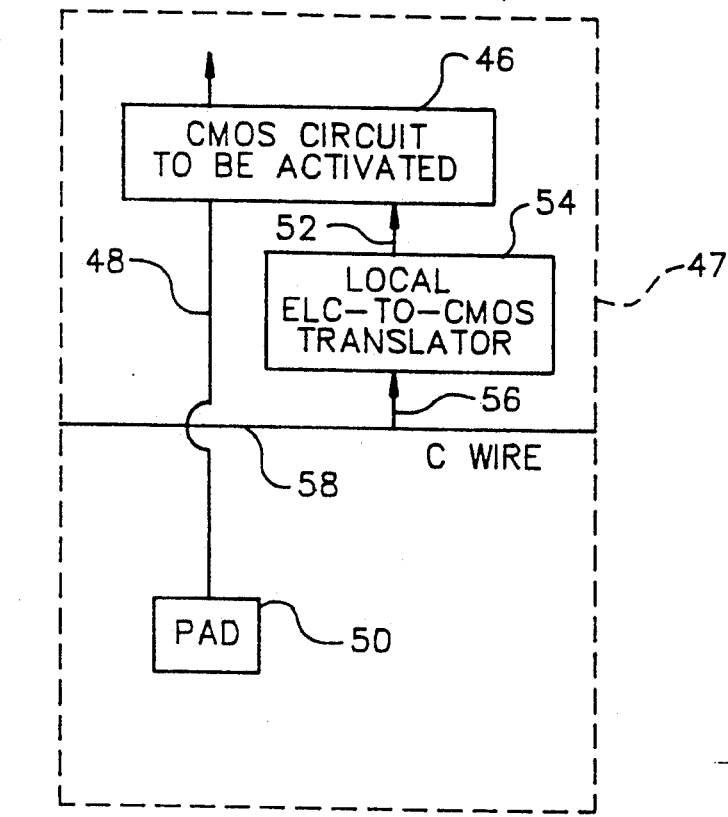
FIG. 4 depicts connections among a portion of the circuitry shown in FIG. 3.
Figure 3:
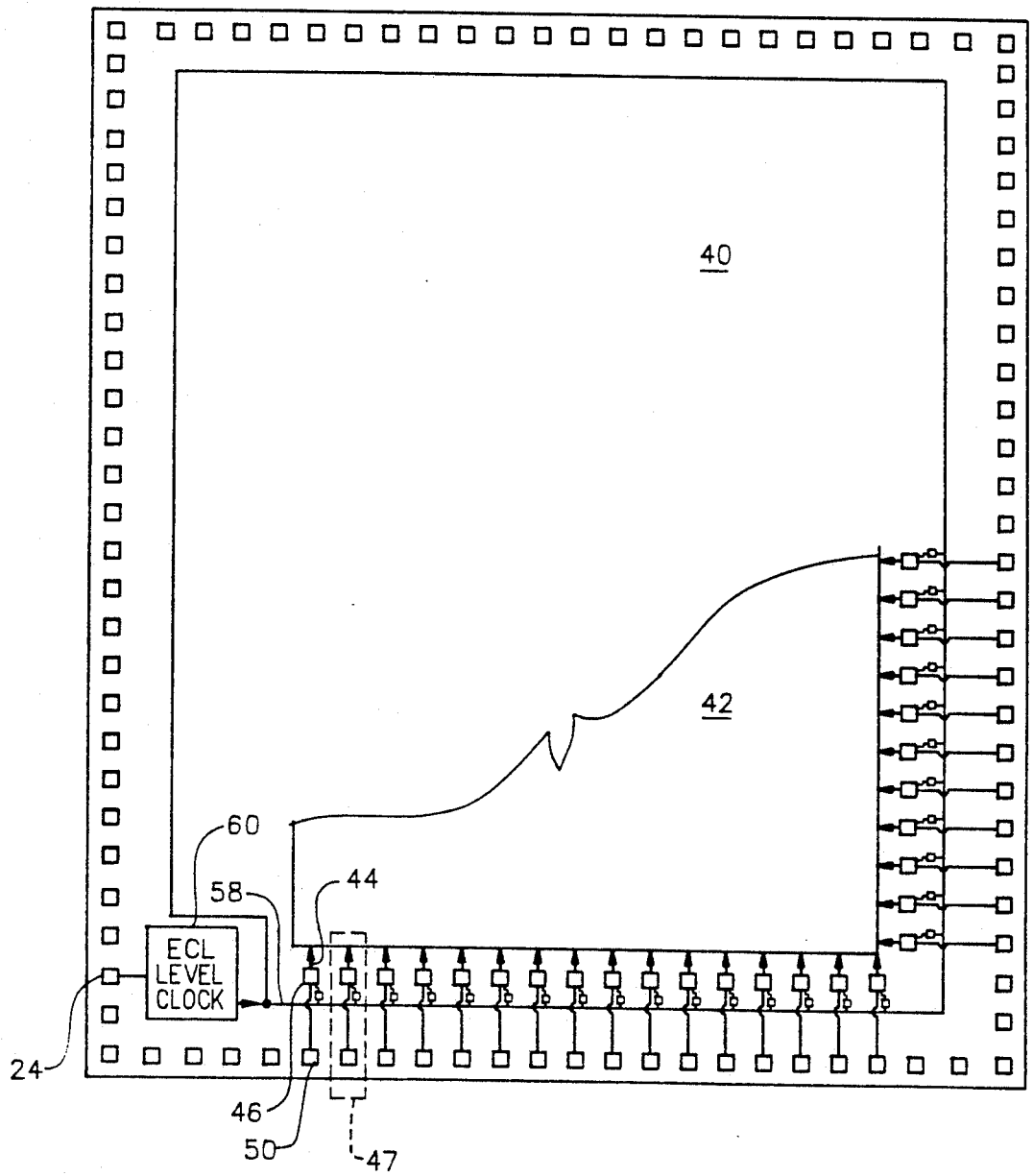
FIG. 3 depicts clock signal distribution according to the present invention.

FIG. 3 depicts a chip 40 according to the present invention also having circuitry 42 which receives input 44 from a plurality of CMOS devices 46. FIG. 4 depicts the connections among a portion 47 of the circuitry. As seen in FIG. 4, the CMOS circuits 46 receive a first input 48 from one of the chip pads 50. The CMOS circuit 46 receives a second input 52 which is provided by a local ECL-to-CMOS translator 54. The translator 54 receives its input 56 from the C-wire 58. In the configuration of FIG. 3, the C-wire 58 carries a clock signal at the ECL level (about 1 volt). The ECL level clock signal is provided by a clock driver 60.

Although the C-wire 58 is still a substantially high-capacitance wire, the effect of the high level capacitance is less severe because the voltage of the clock signal on the C-wire 58 is lower (approximately 1 volt, rather than about 5 volts). The low rise and fall times of ECL drivers results in less dispersive RC line delays. As a result, the delay and skew of the clock signal on the C-wire 58 is lessened, compared to the configuration depicted in FIG. 1.

A number of devices can be used as a translator 54 for converting ECL to CMOS levels. One preferred device is described in U.S. patent application Ser. No. 07/641,984 for "Synchronous ECL to CMOS Translator", filed concurrently herewith.

In light of the above description, a number of advantages of the present invention can be seen. The delay and skew of the clock signal distributed about a chip can be reduced by driving the clock signal at ECL levels, while CMOS-level clock signals needed for CMOS components in a BiCMOS chip are provided by local translators. Although the ECL clock driver has a larger DC power requirement than an equivalent CMOS driver, this factor is offset by the advantages of decreased clock delay. Furthermore, because ECL circuitry is, in general, less temperature-sensitive than CMOS circuitry, the configuration of the present invention has an increased temperature independence compared to previous devices.

Variations and modifications of the present invention can also be used. Local ECL-to-CMOS translators can be used in connection with internal communication wires which are used for signals other than clock signals. Driving a clock distribution wire at ECL levels could be used in connection with a CMOS device as well as a BiCMOS device.

Although the invention has been described by way of a preferred embodiment and various modifications and variations, other modifications and variations can also be used, the application being defined by the appended claims.

What is claimed is:

1. In a BiCMOS integrated circuit having a plurality of bipolar devices and a plurality of CMOS devices, said integrated circuit including a first high-capacitance signal lines, apparatus for providing first and second synchronous clock signals with different signal levels, comprising:
    a first input means for receiving a clock signal;
    means for providing a first clock signal, based on said received clock signal, at a first voltage level, said first clock signal being provided to at least said high-capacitance signal line;
    means for translating said first clock signal to at least a second substantially synchronous clock signal, said means for translating having an input means for receiving said first clock signal and an output means, said second clock signal having a voltage level greater than said first voltage level for providing a clock signal to at lest a first portion of said plurality of CMOS devices said input means of said means for translating being coupled to said high-capacitance line, said output means being coupled to said at least a first portion of said plurality of CMOS devices in the absence of coupling of said output means to said high-capacitance line.

2. Apparatus, as claimed in claim 1, wherein said means for providing a first clock signal and said means for translating said clock signal are provided on a single chip along with said BiCMOS integrated circuit.

3. Apparatus, as claimed in claim 1, wherein said means for translating said first clock signal comprises a plurality of ECL-to-CMOS voltage translators, each of said plurality of translators being coupled to at lest one of said plurality of CMOS devices.

4. Apparatus, as claimed in claim 1, wherein said first voltage level is about one volt and said second voltage level is about five volts.

5. Apparatus, as claimed in claim 1, wherein said high-capacitance signal line has a capacitance greater than about 0.2 pf.

6. A BiCMOS integrated circuit formed on a single chip comprising:
    a plurality of bipolar devices;
    a plurality of CMOS devices coupled to said bipolar devices;
    a first signal line having a capacitance of at lest about 0.2 pf;
    first input pad for receiving a clock signal;
    a clock driver for providing a first clock signal, based on said received clock signal, said first clock signal having a first voltage level of about one volt, said first clock signal being provided to at least said first signal line;
    a plurality of ECL-to-CMOS voltage translators each having an input line and an output line for translating said first clock signal to a second substantially synchronous clock signal, said second clock signal having a voltage level of about five volts, said plurality of translators coupled to said plurality of CMOS devices wherein each translator provides a clock signal to at least one of said plurality of CMOS devices said input line of each translator being connected to said first signal line, said output line of each translator being without any connection to said first signal line.

* * * * *